US010020302B2

(12) United States Patent
Perruchoud et al.

(10) Patent No.: US 10,020,302 B2
(45) Date of Patent: Jul. 10, 2018

(54) HALF-BRIDGE CIRCUIT, H-BRIDGE CIRCUIT AND ELECTRONIC SYSTEM

(71) Applicant: NXP USA, INC., Austin, TX (US)

(72) Inventors: Philippe Perruchoud, Tournefeuille (FR); Hubert Grandry, Espanes (FR); Laurent Guillot, Seysses (FR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/372,452

(22) Filed: Dec. 8, 2016

(65) Prior Publication Data
US 2017/0187372 A1 Jun. 29, 2017

(30) Foreign Application Priority Data
Dec. 23, 2015 (WO) .................. PCT/IB2015/002637

(51) Int. Cl.
H01L 21/8234 (2006.01)
H01L 27/088 (2006.01)
H01L 29/78 (2006.01)

(52) U.S. Cl.
CPC .... *H01L 27/088* (2013.01); *H01L 21/823487* (2013.01); *H01L 29/7827* (2013.01); *H01L 21/823481* (2013.01); *H03K 2217/0009* (2013.01); *H03K 2217/0018* (2013.01)

(58) Field of Classification Search
CPC .......... H01L 27/088; H01L 21/823487; H01L 29/7827; H01L 21/823481; H03K 2217/0009; H03K 2217/0018
See application file for complete search history.

(56) References Cited

U.S. PATENT DOCUMENTS

| | | | |
|---|---|---|---|
| 6,269,014 B1* | 7/2001 | Sander | H02M 7/003 363/132 |
| 9,837,526 B2* | 12/2017 | Dupuy | H01L 29/7804 |
| 9,843,255 B1 | 12/2017 | Goumballa et al. | |
| 2011/0006361 A1* | 1/2011 | Darwish | H01L 21/82341 257/329 |
| 2016/0163849 A1* | 6/2016 | Dupuy | H01L 29/7804 257/334 |
| 2016/0197176 A1 | 7/2016 | Stefanov et al. | |
| 2017/0358329 A1 | 12/2017 | Goumballa et al. | |

* cited by examiner

*Primary Examiner* — Jung Kim
(74) *Attorney, Agent, or Firm* — Charlene R. Jacobsen

(57) ABSTRACT

A half-bridge circuit comprises a high supply contact and a low supply contact. A half-bridge output contact is connectable to drive a load and has a high-side between the high supply contact and the half-bridge output contact and a low-side between the half-bridge output contact and the low supply contact. A high-side bidirectional vertical power transistor at the high-side has a source connected to the high supply contact, and a low-side bidirectional vertical power transistor at the low-side, transistor has a source connected to the low supply contact. The high-side bidirectional vertical power transistor and low-side bidirectional vertical power transistor are connected in cascode and share a common drain connected to the half-bridge output contact, and are controllable to alternatingly allow a current flow from the high supply contact to the half-bridge output contact or from the half-bridge output contact to the low supply contact.

13 Claims, 4 Drawing Sheets

HALF-BRIDGE CIRCUIT, H-BRIDGE CIRCUIT AND ELECTRONIC SYSTEM

CROSS-REFERENCE TO RELATED APPLICATIONS

This application claims the priority under 35 U.S.C. § 119 of application no. PCT/IB2015/002637, filed Dec. 23, 2015 the contents of which are incorporated by reference herein.

FIELD OF THE INVENTION

This invention relates to a half-bridge circuit, an H-bridge circuit and an electronic system.

BACKGROUND OF THE INVENTION

U.S. Pat. No. 6,269,014 discloses a half-bridge circuit. Half-bridge circuits are is used in various power applications such as synchronous buck converters, resonant converters, electronic ballasts, induction heating and motion control, and offers such benefits as four-quadrant switching, zero-voltage switching (ZVS), zero-current switching (ZCS), high-frequency operation, low EMI and high efficiency. Half bridge circuits comprise an upper or high-side and lower or low-side power switch (typically MOSFETs) connected in a cascode arrangement between a positive and negative voltage supply, the node common to the low-side switch and the high-side switch being connected to drive a load.

In classical vertical power semiconductor technology, such as disclosed in U.S. Pat. No. 6,269,014, the high current switches have to be implemented on separate power dices. However, for the half-bridge the drain of the high side switch has to be connected to the source of the low-side switch to allow them to be switched on complementary to each other. This inhibits the low-side switch and the high-side switch being on the same die because in vertical power semiconductors the drain terminal of the power switch is the backside of the die, i.e. the semiconductor substrate bottom, itself. Accordingly, the drain is common for all the power devices on the same die.

SUMMARY OF THE INVENTION

The present invention provides a half-bridge circuit, an H-bridge circuit and an electronic system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
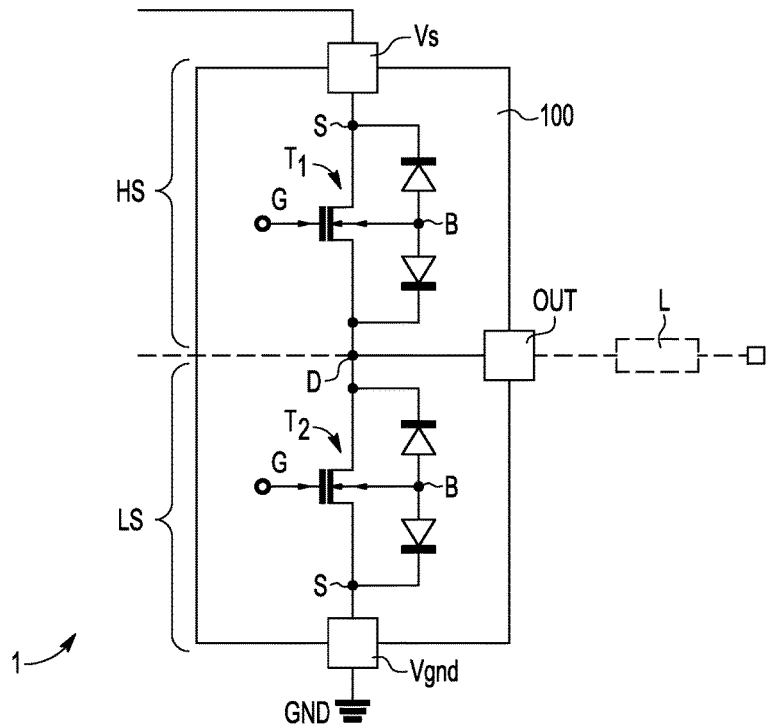
FIG. 1 schematically shows a circuit diagram an example of an embodiment of a half-bridge circuit.

The half-bridge circuit 1 shown in FIG. 1 comprises a high supply contact Vs and a low supply contact $V_{gnd}$. The high supply contact Vs is connectable to a high voltage supply of e.g. 10V or more, such as 25V or more, for example 40V, relative to the low supply contact $V_{gnd}$. It will be apparent that the maximum voltage for the high voltage supply depends on the specific implementation, a suitable maximum has been found to be 100 V or less, such as 90 V or less. The low supply contact $V_{gnd}$ can e.g. be connected to ground GND. The half-bridge circuit 1 further comprises a half-bridge output contact Out connectable to drive a load L (indicated in FIG. 1 with the dashed lines). The half-bridge circuit 1 has a high-side HS between the high supply contact $V_{gnd}$ and the half-bridge output contact Out and a low-side LS between the half-bridge output contact Out and the low supply contact $V_{gnd}$. The high-side HS and the low-side LS provide current paths, between the high supply contact Vs and the half-bridge output Out and between the low supply contact $V_{gnd}$ and the half-bridge output Out respectively. The current paths can be selectively enabled and disabled by power switches $T_1$, $T_2$ in the current paths.

When the half bridge circuit 1 is connected to the load L and operated, the direction of the current through the load will reverse when the half bridge is switched from high to low or vice versa. As shown in FIG. 1 and explained in more detail with reference to FIG. 2, the power switches are bidirectional vertical power transistors. The internal current path though the bidirectional vertical power transistor can be enabled or disabled in a first direction to the first current terminal, e.g. source, from the second current terminal, e.g. drain, or in the opposite second direction and current flowing through the transistor can thus be inhibited effectively in both directions (from the first current terminal, e.g. source, to the second terminal, e.g. drain and vice versa). Accordingly, the high side switch $T_1$ can be open, inhibiting current to flow from the high supply contact Vs to the half-bridge output Out, with the low side switch $T_2$ closed (current flowing thus from the half-bridge output Out to the low side contact $V_{gnd}$) or vice versa, even when on the same die with a common drain.

In the shown example, a high-side bidirectional vertical power transistor $T_1$ at the high-side HS has a first current terminal S, e.g. source connected to the high supply contact Vs. A low-side bidirectional vertical power transistor $T_2$ at the low-side LS has a first current terminal S, e.g. the source, connected to the low supply contact $V_{gnd}$. The high-side bidirectional vertical power transistor $T_1$ and low-side bidirectional vertical power transistor $T_2$ are connected in cascode and share a common second current terminal D, e.g. drain. The second current terminal D is connected to the half-bridge output contact. The bidirectional vertical power transistors $T_1$, $T_2$ are controllable to alternatingly provide a current from the half-bridge output contact Out to the low supply contact $V_{gnd}$ or from the high supply contact Vs to the half-bridge output contact out. In a high mode of the half-bridge circuit the high side switch $T_1$ is closed and the low side switch open $T_2$ or phrased in a different manner: the high side is on and the low side is blocked. The load is therefore connected to the high voltage supply and current flows from the high side supply to the load L. In a low mode of the half-bridge circuit the low side switch is closed and the high side switch open or phrased in a different manner: the low side is on and the high side is blocked. The load is therefore connected to the low voltage supply and current flows from the load into the low side supply, i.e. in the opposite direction compare to the high mode (that is after a short transitional period during which inductances in the load oppose the change in current with a resulting voltage increase).

Figure 2:
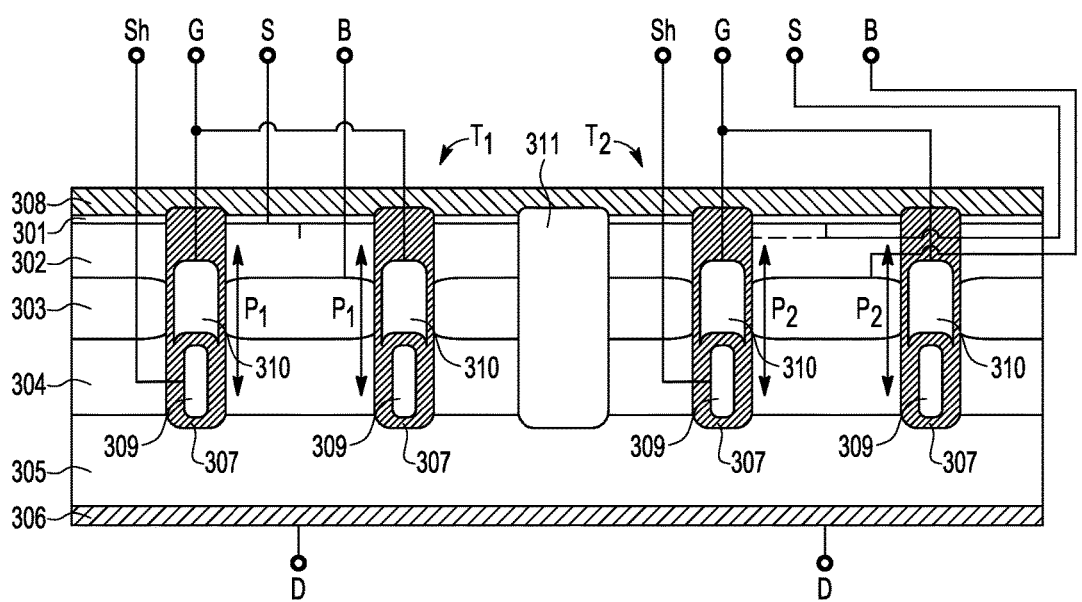
FIG. 2 schematically shows a cross-sectional view of an example of a vertical bidirectional power transistors suitable for the example of FIG. 1.

In FIG. 2 a cross-sectional view of bidirectional vertical power transistors $T_1$ and $T_2$ in a common drain configuration is shown to explain the bidirectional operation of the bidirectional vertical power transistors $T_1$ and $T_2$. The bidirectional vertical power transistors $T_1$, $T_2$ can support high energies, i.e. high currents and/or voltages both from the first current terminal to the second terminal, e.g. source towards the drain, and vice-versa, e.g. drain D towards source S. The bidirectional vertical power transistor can for example have a current maximum of more than 1 A, such as 10 A or more, such as 25 A or more, and for example with a maximum of 50 A or less, such as not more than 30 A and/or a positive breakdown voltage of at least 25 V, for example 50 V or more, and a negative breakdown voltage of at least 25 V, for example 30 V or more, such as 50 V or more, for example 100 V or more, e.g. 200 V or more.

It should be apparent that in FIG. 2 for each transistor only a single transistor or "cell" is shown, and that in an actual semiconductor product each of the bidirectional vertical power transistors $T_1$ and $T_2$ can comprise an arrangement of a plurality of these cells (e.g. seen from above multiple fingers may be positioned next to each other). Depending on the specific implementation, the semiconductor product can comprise several tens, hundreds, thousands or more cells in a suitable arrangement (e.g. 2-dimensional matrix or in an array) and connected in parallel to form a single power transistor device. The bidirectional vertical power transistors $T_1$ and $T_2$ can for example each be implemented as described in the applicant's co-pending International Patent Application PCT/IB2013/002209, the entire contents of which are incorporated herein by reference. In case a bidirectional vertical power transistor comprises a plurality of cells, the terminals of each of the different cells can be connected to the electrodes, to allow the different cells to be controlled simultaneously to conduct current through a layer stack from a first current terminal to a second current terminal or vice versa.

It should further be noted that, seen from a top view, the bidirectional vertical power transistors $T_1$ and $T_2$ have an elongated finger like shape and that the different electrodes may connect to the respective element at a location of the finger suitable for the specific implementation and not necessarily at the section shown in FIG. 2. E.g. the body 303 may be connected at opposite ends of the finger to the body electrode B, the source 301 to the source electrode S at the opposite ends of the finger and a position in the middle of the finger, etc.

Still referring to FIG. 2, a stack of suitably patterned and structured layers 301-306 has been provided and the bidirectional vertical power transistor T is formed in the layer stack e.g. by processing, such as successive patterning, doping, deposition, etching, etc. of the stack. The layer stack comprises, from the bottom surface until the top surface of the stack: a drain electrode layer 306 at a backside of a wafer level semiconductor substrate 305. At the frontside or top of the substrate 305, the stack comprises (in order from bottom to top): a first drift layer 304, a body layer 303, a second drift layer 302, and a source layer 301. The top surface of the layer stack is covered by a passivation layer 308 of a suitable dielectric material which shields the rest of the power transistor T from ambient influences, such as oxidation or otherwise. The bidirectional vertical power transistor is defined in the horizontal direction, i.e. parallel to substrate 305, by vertical trenches 307 extending from a top surface of the stack onto, and in the example into a recess of the substrate. The vertical trenches are provided with a gate 310 and a shield plate 309.

The bidirectional vertical power transistors $T_1$ and $T_2$ shown in FIG. 2 are bidirectional field effect transistors with trenches, also known as bidirectional vertical trench FETs. As shown except for the common drain the bidirectional vertical power transistors $T_1$ and $T_2$ are electrically isolated by a suitable isolation, in this example shown as an electrically isolating trench 311 extending from the top surface onto or into the substrate 305 but to a depth less than the thickness of the substrate 305. Each transistor has a first current terminal a source electrode S, and as a second current terminal a drain electrode D. For each of the bidirectional vertical power transistors $T_1$ and $T_2$ a respective electrical path $P_1$, $P_2$ is present between the first current terminal S and the second current terminal D, through the first drift region 304, the body 303 and the second drift region 302. The electrical paths $P_1$, $P_2$ can be selectively enabled or disabled to allow current to flow through the respective transistor $T_1$, $T_2$ in a first direction, e.g. to the first current terminal from the second terminal, or a second direction, opposite to the first direction, by applying suitable signals and power to the electrodes B, D, G, Sh and S, which are respectively connected to body 303, drain 306, gate 310, shields 307 and source 301 of the power transistor T.

On the die on which the bidirectional vertical power transistors $T_1$, $T_2$ are present, the drain electrode D is connected to the second current terminal and the source electrode S is connected to the first current terminal of the bidirectional vertical power transistor. The gate or control electrode G is connected to the control terminal. As shown in the example of FIG. 2, each of the bidirectional vertical power transistors can further comprise a body electrode B connectable to an external power supply and connected to the body layer 303 of the bidirectional vertical power transistor T. A separate shield electrode Sh is provided via which the voltage of shield plates 309 can be controlled separately from the voltage and/or current of the other electrodes. However, the source electrode S can alternatively be connected to the shield plate 309 of each of the power transistors 100 and hence the voltage of the shield plate be coupled to the first current terminal.

The bidirectional vertical power transistors $T_1$, $T_2$ can be used to control the flow of current. The shown example of bidirectional vertical power transistors can for example be used in a method for operating a power transistor as described below, although it will be apparent that other types of bi-directional vertical power transistors can be used as well to perform such a method and that the bi-directional vertical power can be used in other methods. Each of the bidirectional vertical power transistors can be operated intermittently in a first direction or a second direction, i.e. bi-directional. The bi-directional vertical power transistor can be symmetric with positive and negative break down voltages that have the same absolute value, or be asymmetric, with different values, depending on the specific implementation. For instance, depending on the specific implementation the thickness of the first and/or second drift region can be adapted to obtain a breakdown voltage for the specific implementation. For an asymmetric transistor, a suitable positive breakdown voltage has found to be between 1.5 and 2 times that of the negative breakdown voltage, such as 45 V for a 25 V negative breakdown voltage.

The bi-directional nature of the bidirectional vertical power transistor T will now be described in operation, using the example of an n-type power transistor. In a first direction and in respect of switching the bidirectional vertical power transistor T on (e.g. for the low side switch $T_2$ when the half bridge is low), a positive voltage (relative to the source) can be applied to the drain electrode D. The body electrode B can be connected to the source electrode S, so as to electrically couple the body 303 to the source 301 of the transistor T, as explained below in more detail with reference to the operation of the circuits shown in FIG. 5. To the shield plate a voltage lower than the voltage of the drain electrode (e.g. 0 V or the source voltage if the drain electrode is at a positive voltage) can then be provided to shield the gate from the voltage applied to the drain electrode D. Applying a positive gate-source bias voltage, Vgs>0 V, to the gate electrode G causes a depletion field effect through the gate dielectric at an interface between the body 303 and the trenches 307 in which the gate 310 is provided. Vgs can for instance be provided by an external gate driver circuit GD (such as shown in FIG. 6) connected to the gate electrode G. When the gate-source bias voltage exceeds a threshold voltage Vth, an inversion conducting n-layer is formed along the interface of the trench 307 and the body 303, which conducts the majority of carriers injected from the source 301 to be collected by the drain 306. This results in the current path being opened and current flowing through the path.

In the first direction and in an off-state of the bidirectional vertical power transistor T (e.g. for the high side switch $T_1$ when the half bridge is low), the body 303 can still be electrically tied to the source and so be subjected to a source potential. The gate bias voltage can be set to a lowest potential, e.g. Vgs=0 V. As a result, a first depletion layer is formed around a bottom p-n junction formed by the interface of the body 303 and the first drift region 304. By increasing the drain-source bias voltage, Vds, a first space charge region of the depletion layer can increase to the low-doped bottom part of the first drift region 304. The electrical field in the region thereby increases and when a critical field is reached, an avalanche phenomena by carrier impact ionization can be observed causing breakdown of the reverse biased junction mentioned above.

In the second direction a positive voltage (relative to the drain) can be applied to the source 301 (e.g. for the high side switch $T_1$ when the half bridge is high). In the on-state, the body electrode can be set such that the drain potential is coupled to the body 303. In the second direction, a positive bias voltage, e.g. the source voltage, can be provided to the shield plate and the gate biased relative to the drain 306. This allows to reduce the electrical field in at least a part of the first drift region 304, and accordingly the breakdown voltage can be increased. A positive gate bias voltage, Vgd>0 V, can be applied to the gate by the external gate driver circuit, thereby causing a depletion field effect through the gate dielectric into the body along the inner sidewalls of the trenches 307. When the gate bias voltage exceeds the threshold voltage Vth an inversion conducting layer can be formed along the interface of the trench dielectric and the body, which can conduct the majority of the carriers injected from the substrate 305 and collected by the source 301.

In the second direction (e.g. in case of a reverse battery or for the low side switch $T_2$ when the half bridge is high),) and in an off state, the body 303 can still be electrically tied to the potential of the drain and a positive voltage (relative to the drain) be applied to the source 301. The gate-drain bias voltage, Vgd, can be set to the lowest potential, namely, Vgd=0V. A second depletion layer can be formed around a top p-n junction formed by the interface of the body and the first drift region 302. By increasing the source-drain bias voltage, Vsd, a second space charge region of the depletion layer can increase to the low-doped top part of the first drift region 302 thus effectively blocking the current flow. The electrical field in the region can thereby increase and when a critical field is reached, an avalanche phenomena by carrier impact ionization can be observed causing breakdown of the reverse biased junction mentioned above, thereby implementing the blocking voltage.

It will be apparent that each of the electrodes or feeds of the transistor, such as electrodes B,D,G,Sh and S those shown in FIG. 2 is connectable to external circuitry, such as a power supply or control logic circuitry, through the terminals 201-204 provided on the die. The connection between the electrodes and the terminals can be provided in any conventional manner, e.g. using metal connections on an interconnect layer of the die.

As follows from the above, in FIG. 2, the bidirectional transistor $T_1$ can thus be operated in a first or high, state of the half-bridge to have the source at a positive voltage, such as the high supply voltage Vs, and the drain connected to the bridge output Out and controlled to be in an on-state and allow a current to flow from source to drain, while the other bidirectional transistor $T_2$ is connected, because the drain is common with the other transistor, with the drain to the bridge output Out and the source to the, lower, low supply voltage and in an off-state and block the current in that direction. When the half-bridge is switched to its second state, vice versa, the bidirectional transistor $T_1$ can be operated to have the source at a positive voltage, such as the high supply voltage Vs, and the drain connected to the bridge output Out and controlled to be in an off-state and block the current in the opposite direction, while the other bidirectional transistor $T_2$ is connected is controlled to be in an on-state and allow the current in the opposite direction.

Figure 3:
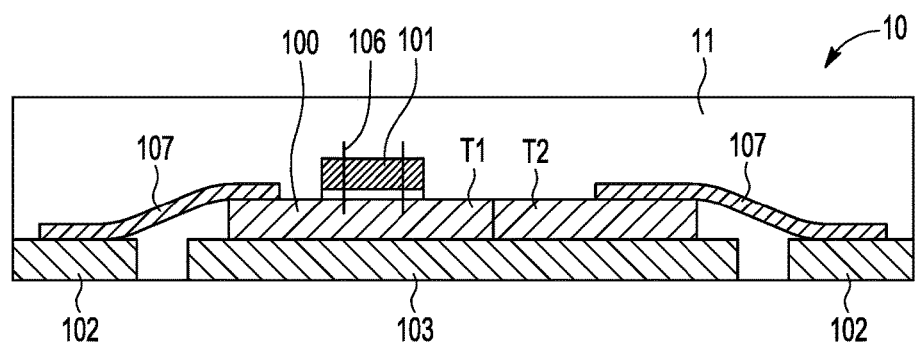
FIG. 3 schematically shows a cross-sectional view of an example of a packaged half bridge integrated circuit.
Figure 4:
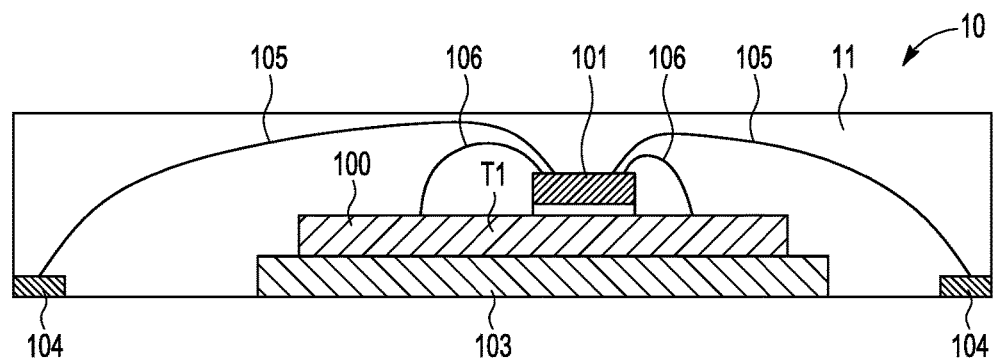
FIG. 4 schematically shows a cross-sectional view of the example FIG. 3 perpendicular to the view in FIG. 3.

Referring to FIGS. 3 and 4 the example of a packaged half-bridge circuit 1 shown therein comprises a package or casing 10, e.g. made from epoxy or other suitable packaging material 11, with a number of pins 102-104, also referred to as leads, at an outside of the package. Inside the package 10, a die 100 with bidirectional vertical power transistors $T_1$, $T_2$ is present as well as a driver circuit 101 therefore. The driver circuit 101 is connected, e.g with bondwires or other suitable electrically conducting connection, to the body terminal B and the control terminal G of each of the bidirectional vertical power transistors $T_1$, $T_2$. The driver circuit 101, when the half-bridge circuit is in operation, drives the bidirectional vertical power transistors $T_1$, $T_2$ to alternatingly be in an on and an off state and thereby to alternatingly provide a current from half-bridge output contact to the low supply contact or from the high supply contact to the half-bridge output contact. The driver circuit 101 controls, via the body B and the control terminal, the bidirectional current path $P_1$ of the first bidirectional vertical power transistors $T_1$ to be open in a forward direction, from the first current terminal S to the second terminal D, when the current path $P_2$ through the second bidirectional vertical power transistors $T_2$ in the reverse second direction is closed and vise versa, by applying a suitable control voltage at the control terminal G of the transistors $T_1$, $T_2$.

It will be apparent that the driver circuit 101 may be connected to other terminals and that the half-bridge circuit 1 may have additional pins connected to the driver circuit 101. For example, the driver circuit 101 may further be connected to the first current terminal S and/or the second current terminal D of the bidirectional vertical power transistors $T_1$, $T_2$, e.g. to control the body and control terminal as a function of the voltage applied to the first current terminal S and/or the second current terminal D, e.g. for example as a function of the voltage difference between first current terminal S and the control terminal G, or between the second current terminal D and the control terminal G.

The pins 102-104 comprise a, a first current pin 102, a second current pin 103 and control pins 104. The package may have just those pins. However it will be apparent that further pins may be present, for example to receive or output data or to connect the package to e.g. sensors or driver circuitry of an electronic system.

As shown the pins or leads 102-104 are partly exposed to the exterior of the package to e.g. allow them to be soldered to a printed circuit board or otherwise electrically connect them to other parts of an electrical system. The pins 102-104 extend into to an inside 11 of the package 100 and are connected to terminals on the semiconductor die or dies inside the package to provide a voltage and/or current connection between the outside and the inside 11. In the shown example, the pins are formed by leads of a lead frame, of which power leads 102,103 are located at the bottom side of the package and exposed at their bottom surface whereas the low voltage control pins 104 are exposed at the sides of the package 10.

The terminals are connected to the pins or leads 102-104 in various manners. For each of the bidirectional vertical power transistors $T_1$, $T_2$, the control terminal G of is connected via an inter-die bondwire 106 to a corresponding terminal of a control circuit 101, which in turn is connected to the control pin 104 via a die-to-pin bondwires 105. For each of the bidirectional vertical power transistors $T_1$, $T_2$, the first current terminal S is in this example at a topside of the die and connected via a respective electrically conductive clip attach 107, e.g. from copper or another metal, to a corresponding first current pin 102, which in this example is an exposed plate at the bottom of the package. The exposed plates and clip attaches are sufficiently large to handle the current and voltages of the bidirectional vertical power transistors $T_1$, $T_2$. The second current terminal D, which is common to the bidirectional vertical power transistors $T_1$, $T_2$ is provided at a bottom side of the die and attached to an exposed plate or common power pad 103, in this example a lead frame substrate, via an electrically and thermally conducting die attach material 108. In this example the entire die is attached to that plate.

In the examples of FIGS. 3 and 4, the half bridge circuit package 10 comprises two semiconductor dices 100,101. The bidirectional vertical power transistors $T_1$, $T_2$ are provided on a single power die 100. The driver circuit is provided on a separate control die 101, separate from the power die 100

Figure 5:
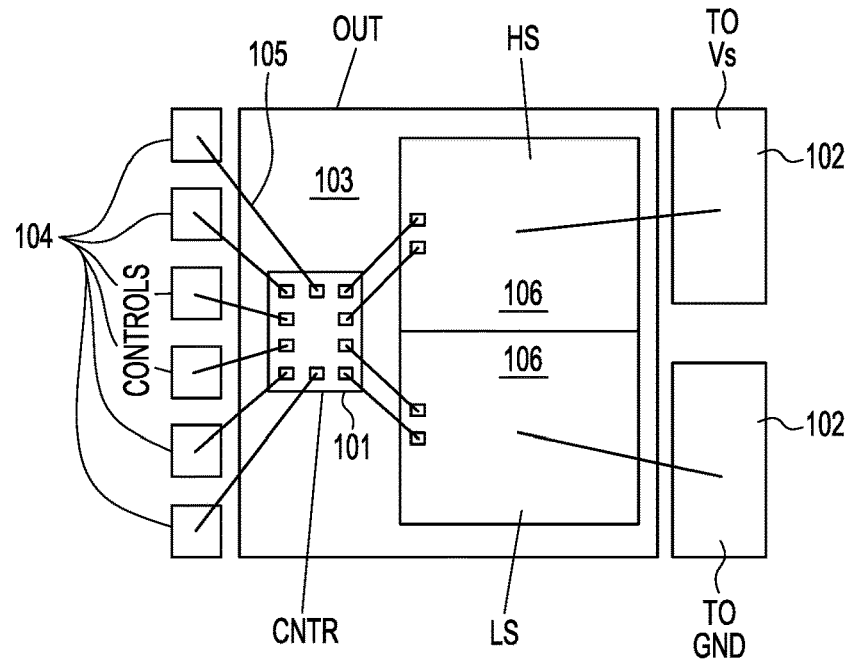
FIGS. 5 and 6 schematically show top views of examples of an embodiment of a half-bridge circuit.
Figure 6:
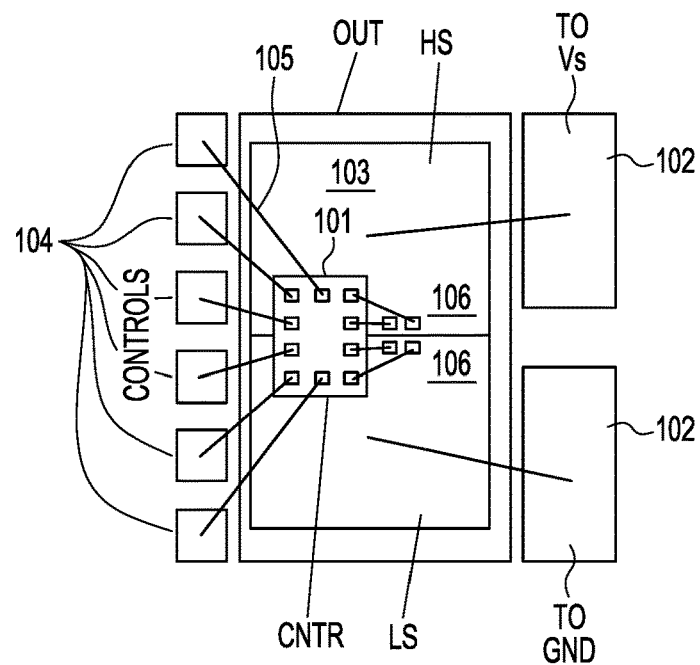

As more clearly visible in the top-views of FIGS. 5 and 6, the bidirectional vertical power transistors T can be provided on a power die 100 which is placed inside the package and the driver circuit 101 is provided on a separate control die connected to the power die, e.g. via bondwires or other suitable inter-die connectors. In the example of FIG. 5, the control die 101 is positioned next to the power die 100, e.g. on a separate die attach flag. This allows a technically non complex packaging. In the example of FIG. 6, the power die and the control die are in a stacked configuration, with the dies on top of each other. This allows a reduction of the footprint of the package. The control die in FIG. 6 is significantly smaller than the power die and attached to the power die with a suitable die attach material, such as film/paste. However, it will be apparent that the bidirectional vertical power transistors $T_1$, $T_2$ and the driver circuit 101 may alternatively be implemented on the same die.

Figure 7:
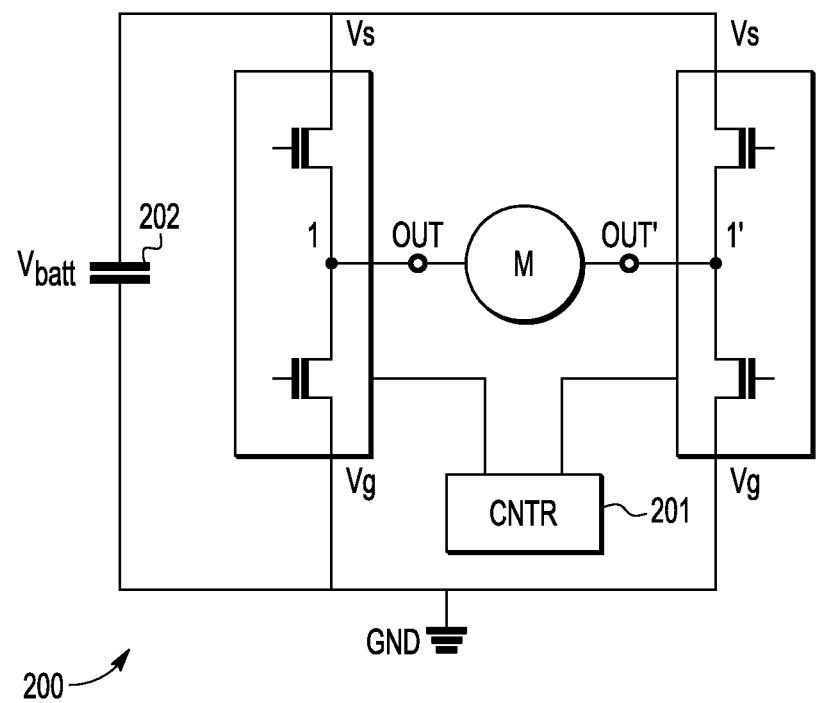
FIG. 7 schematically shows an example of an electronic system.

Referring to FIG. 7, the half-bridge circuit may be used in an H-bridge circuit or an electronic system, e.g. to drive as in the shown example a motor M or other type of load. Although shown in the example as connected to a load and supply, it will be apparent that the H-bridge circuit may be provided separately e.g. as a printed circuit board on which the half-bridge circuits are mounted (optionally with other electronic components) and connectable to a load and power supply.

FIG. 7 shows an H bridge circuit comprising a first half bridge circuit 1 connected with its half-bridge output contact Out to a first side of a load M, and a second half bridge circuit 1' connected with its half-bridge output contact Out' to a second side of the load. The high supply contacts are connected to a positive pole of a battery 202, whereas the low supply contacts are connected to the negative pole of the battery 202. The motor (or other load) is thus driven by a supply, in this example the battery voltage Vbat. The half bridge circuits 1, 1' are connected to a control circuit 201 which controls both half bridge circuits in a manner suitable to drive the electric motor, as generally known in the art.

In the foregoing specification, the invention has been described with reference to specific examples of embodiments of the invention. It will, however, be evident that various modifications and changes may be made therein without departing from the broader scope of the invention as set forth in the appended claims and that the claims should not be interpreted as limited to the specific examples disclosed.

For example, the semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. Therefore, many options exist for transferring signals.

Although specific conductivity types or polarity of potentials have been described in the examples, it will appreciated that conductivity types and polarities of potentials may be reversed.

Also for example, in one embodiment, the illustrated examples may be implemented as circuitry located on a single integrated circuit or within a same device. For example, the half-bridge and the driver circuit may be implemented in a single integrated circuit package. Likewise, two dies, each with a half-bridge circuit 1, may be connected to each other as an H-bridge circuit, and integrated in a single integrated circuit package to obtain an H-bridge integrated circuit. Alternatively, the examples may be implemented as any number of separate integrated circuits or separate devices interconnected with each other in a suitable manner. For example, the driver circuit may be provided as a separate integrated circuit, and e.g. be provided as a chipset, optionally mounted on a printed circuit board, with a half-bridge circuit 1 or an H-bridge circuit.

Also, the invention is not limited to physical devices or units implemented in non-programmable hardware but can also be partly implemented in programmable devices or units able to perform the desired device functions by operating in accordance with suitable program code, for example in an integrated circuit comprising the half-bridge or H-bridge circuit together with a bridge driver circuit which is programmable or configurable with a suitable state machine which controls the state of the half-bridge or H-bridge circuit as a function of e.g. the load, time, supply voltage or otherwise. For example, the driver circuit may be a microcontroller programmable to control the half-bridge or H-bridge circuit.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A half-bridge circuit, comprising:
   a high supply contact and a low supply contact,
   a half-bridge output contact connectable to drive a load;
   a high-side between the high supply contact and the half-bridge output contact and a low-side between the half-bridge output contact and the low supply contact;
   a high-side bidirectional vertical power transistor at the high-side, the high-side bidirectional vertical power transistor having a source connected to the high supply contact; and
   a low-side bidirectional vertical power transistor at the low-side, the low-side bidirectional vertical transistor having a source connected to the low supply contact,
   wherein the high-side bidirectional vertical power transistor and the low-side bidirectional vertical power transistor are connected in cascode and share a common drain connected to the half-bridge output contact, and are controllable to alternatingly allow a current flow from the high supply contact to the half-bridge output contact or from the half-bridge output contact to the low supply contact.

2. The half-bridge circuit as claimed in claim 1, comprising a package with an interior in which the bidirectional vertical power transistors are situated.

3. The half-bridge integrated circuit as claimed in claim 2, wherein the bidirectional vertical power transistors are attached with their drains to a common power pad, the common power pad being exposed to the exterior of the package.

4. The half-bridge circuit as claimed in claim 1, the bidirectional vertical power transistors being on a single semiconductor power die.

5. The half-bridge circuit as claimed in claim 1, wherein the bidirectional vertical power transistors each have a gate electrode, and the half-bridge circuit further comprises a driver circuit connected to the gate electrodes, for providing at the gate electrodes control signals to control the bidirectional vertical transistors to alternatingly provide a current from the half-bridge output contact to the low supply contact or from the high supply contact to the half-bridge output contact.

6. The half-bridge circuit as claimed in claim 5, wherein the bidirectional vertical power transistors are on a single semiconductor power die, and the driver circuit is provided on a control die, separate from the power die.

7. An H-bridge circuit, comprising two half bridge circuits, each of the bridge circuits having a half-bridge output contact to a respective one of a first side of a load and a second side, opposite to the first side, of the load, at least one of the half bridge circuits being as claimed in claim 1.

8. An electronic system, comprising an H-bridge circuit as claimed in claim 7 and a load connected to the half-bridge output contacts of the H-bridge.

9. The half-bridge circuit as claimed in claim 2, the bidirectional vertical power transistors being on a single semiconductor power die.

10. The half-bridge circuit as claimed in claim 3, the bidirectional vertical power transistors being on a single semiconductor power die.

11. The half-bridge circuit as claimed in claim 5, wherein the driver circuit is provided on a separate control die, separate from the power die.

12. An H-bridge circuit, comprising two half bridge circuits, each of the bridge circuits having a half-bridge output contact to a respective one of a first side of a load and a second side, opposite to the first side, of the load, at least one of the half bridge circuits being as claimed in claim 3.

13. An H-bridge circuit, comprising two half bridge circuits, each of the bridge circuits having a half-bridge output contact to a respective one of a first side of a load and a second side, opposite to the first side, of the load, at least one of the half bridge circuits being as claimed in claim 7.

\* \* \* \* \*